United States Patent
Graumann

(10) Patent No.: US 10,230,552 B1
(45) Date of Patent: Mar. 12, 2019

(54) SYSTEM AND METHOD FOR DECISION FEEDBACK EQUALIZER (DFE) ADAPTATION

(71) Applicant: Microsemi Storage Solutions, Inc., Aliso Viejo, CA (US)

(72) Inventor: Peter John Waldemar Graumann, Calgary (CA)

(73) Assignee: Microsemi Storage Solutions, Inc., Chandler, AZ (US)

(*) Notice: Subject to any disclaimer, the term of this patent is extended or adjusted under 35 U.S.C. 154(b) by 0 days.

(21) Appl. No.: 16/046,885

(22) Filed: Jul. 26, 2018

(51) Int. Cl.
H04L 25/03 (2006.01)
H03M 9/00 (2006.01)

(52) U.S. Cl.
CPC ......... *H04L 25/03057* (2013.01); *H03M 9/00* (2013.01)

(58) Field of Classification Search
CPC .............. H04L 25/03; H04L 25/03057; H04L 25/03019
USPC .......................................................... 375/133
See application file for complete search history.

(56) References Cited

U.S. PATENT DOCUMENTS

| 9,860,089 B2* | 1/2018 | Lee ................... H04L 25/0307 |
| 2010/0238993 A1* | 9/2010 | Huang ................. H04L 7/0337 375/233 |
| 2010/0329322 A1* | 12/2010 | Mobin ............. H04L 25/03057 375/231 |
| 2016/0127155 A1* | 5/2016 | Johnson ........... H04L 25/03878 375/233 |
| 2017/0005841 A1* | 1/2017 | Komori .................. H04L 25/08 |
| 2018/0167240 A1* | 6/2018 | Li ..................... H04L 25/03057 |

* cited by examiner

*Primary Examiner* — Kevin Kim
(74) *Attorney, Agent, or Firm* — Glass & Associates; Molly Sauter; Kenneth Glass

(57) ABSTRACT

A system and method for decision feedback equalizer (DFE) tap adaptation. An input signal is received at a DFE of a receiver, wherein the input signal comprises a serial bit stream of encoded symbols. Data samples and error samples are taken from the input signal and the data samples and the error samples are aligned establish a plurality of pairs of data samples and error samples, wherein the data sample and error sample of each of the plurality of pairs of data samples and error samples are from locations in the serial bit stream of encoded symbols that are known to be uncorrelated with each other. The DFE tap weights are then adjusted based upon the plurality of pairs of data samples and error samples.

19 Claims, 9 Drawing Sheets

SYSTEM AND METHOD FOR DECISION FEEDBACK EQUALIZER (DFE) ADAPTATION

BACKGROUND OF THE INVENTION

Digital communication receivers, such as those used in Serializer/Deserializer (SerDes) high-speed communication systems, are designed to sample an analog waveform and then reliably detect the sampled data. In high-speed SerDes implementations, a lossy communication channel exists between the transmitter and the receiver, and at high data rates, the received data stream may be severely distorted, thereby requiring equalization before the received data can be effectively sampled. An effective way for equalizing channel loss and for negating the impact of intersymbol interference (ISI) is to implement a decision feedback equalizer (DFE) in the receiver.

Data encoding using encoding schemes, such as the 8b/10b encoding, wherein 8-bit words are encoded into 10-bit symbols, is commonly used in communication systems to support continuous transmission with a balanced number of ones and zeros in the data stream and to provide for the detection of single bit transmission errors. While 8b/10b encoding provides many desirable properties in a high-speed communication system, correlation between the various bits within a given 8b/10b symbol may decrease the effectiveness of the DFE of the receiver. In a DFE, each previously decided data bit of the received signal is multiplied by a DFE tap and then summed together with other DFE taps to create a correction voltage to be applied on a current sample of the received signal. During adaptation of the DFE filter, the weight values for each tap of the DFE are adapted over time using the correlation information within the receiver, with the assumption that all correlations are the result of intersymbol interference (ISI) from the channel. However, correlations between various bits of the received signal itself may lead to the determination of incorrect tap weights for the DFE, which may degrade the performance of the receiver or may result in a broken communication link between the transmitter and the receiver.

Accordingly, what is needed in the art is an improved system and method for DFE tap adaptation that reduces the effect of data correlations inherent in a data encoding scheme, such as an 8b/10b encoding scheme.

SUMMARY OF THE INVENTION

In various embodiments, the present invention provides a system and method for DFE tap adaptation that minimizes the effect of data correlations present in an encoded symbol of a signal received at a receiver, such as a SerDes receiver.

In one embodiment, the present invention provides a method for DFE tap adaptation which includes, receiving an input signal at a DFE of a receiver, wherein the input signal comprises a serial bit stream of encoded symbols. The method further comprises, sampling the input signal, using a data sampler, to provide data samples and sampling the input signal, using an error sampler, to provide error samples. Following the collection of the data samples and the error samples, the method continues by aligning the data samples and the error samples to establish a plurality of pairs of data samples and error samples, wherein the data sample and error sample of each of the plurality of pairs of uncorrelated data samples and error samples are from locations in the serial bit stream of encoded symbols that are known to be uncorrelated with each other. The method continues by adjusting a tap weight of each of a plurality of DFE taps based upon the plurality of pairs of uncorrelated data samples and error samples.

In a particular embodiment, each of the plurality of encoded symbols comprising the serial bit stream of the input signal may be 8b/10b (8-bit words to 10-bit symbols) encoded symbols.

Alignment of the data samples and the error samples to establish the plurality of pairs of data samples and error samples may be accomplished using comma characters or di-bit correlation properties of the input signal. Additionally, aligning the data samples and the error samples may require dropping one or more bits of the input signal.

In an additional embodiment, the present invention provides a system which includes a DFE comprising one or more taps, the decision feedback equalizer for receiving an input signal comprising a serial bit stream of encoded symbols, and a correlation analyzer coupled to the DFE. The DFE includes one or more data samplers for sampling the input signal to provide data samples and one or more error samplers for sampling the input signal to provide error samples. The system further includes an alignment analyzer coupled to the DFE, the alignment analyzer for aligning the data samples and the error samples to establish a plurality of pairs of data samples and error samples, wherein the data sample and error sample of each of the plurality of pairs of data samples and error samples are from locations in the serial bit stream of encoded symbols that are known to be uncorrelated with each other. A correlation analyzer, coupled to the DFE and the alignment analyzer, is provided for adjusting a tap weight of the one or more DFE taps based upon the plurality of pairs of data samples and error samples. In various embodiments, the tap weight of the one or more DFE taps may be increased if the correlation count indicates that the data samples are correlated and the tap weight of the one or more DFE taps may be decreased if the correlation count indicates that the data samples are anti-correlated.

The encoded symbols in the input signal may 8b/10b encoded symbols and the DFE may be implemented in a SerDes receiver.

Accordingly, in various embodiments, the present invention provides an improved system and method for DFE tap adaptation that reduces the effect of data correlations inherent in a data encoding scheme, such as an 8b/10b encoding scheme by selecting data sample and error sample pairs that are from locations within the serial bit stream that are known to be uncorrelated.

BRIEF DESCRIPTION OF THE DRAWINGS

The accompanying drawings, which are incorporated in and form a part of this specification, illustrate various embodiments and, together with the Description of Embodiments, serve to explain principles discussed below. The drawings referred to in this brief description should not be understood as being drawn to scale unless specifically noted.

DETAILED DESCRIPTION OF THE INVENTION

Figure 1:
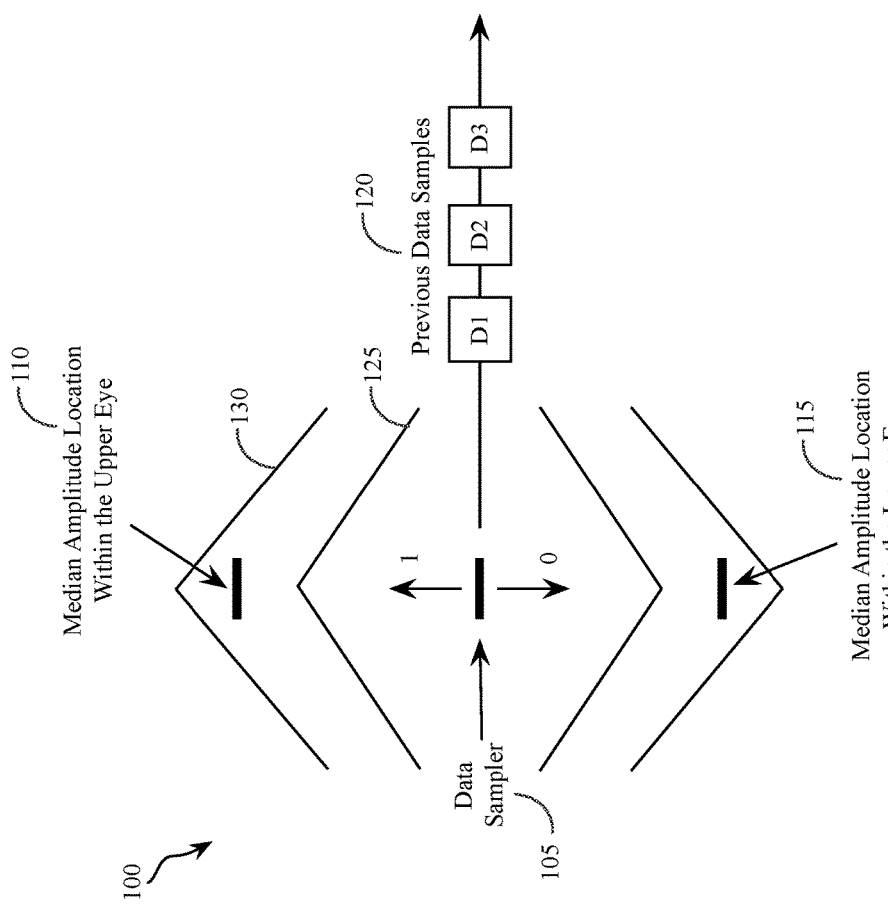
FIG. 1 is a diagram illustrating data and error samplers within a serial/deserializer (SerDes) device eye, in accordance with the prior art.

Reference will now be made in detail to various embodiments, examples of which are illustrated in the accompanying drawings. While various embodiments are discussed herein, it will be understood that they are not intended to be limiting. On the contrary, the presented embodiments are intended to cover alternatives, modifications, and equivalents, which may be included within the spirit and scope of the various embodiments as defined by the appended claims. Furthermore, in this Detailed Description of the Invention, numerous specific details are set forth in order to provide a thorough understanding. However, embodiments may be practiced without one or more of these specific details. In other instances, well known methods, procedures, components, and circuits have not been described in detail as not to unnecessarily obscure aspects of the described embodiments.

It will be understood that, although the terms first, second, third, etc., may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In accordance with various embodiments of the present invention, an improved system and method for DFE tap adaptation is provided. In particular, the present invention provides a system and method that ensures robust adaptation of DFE taps while running 8b/10b encoded data.

Serial communications at high-speed data rates can be limited by channel loss and ISI resulting from the physical characteristics of the data communications channel between the transmitter and the receiver, such as in a Serial/Deserializer (SerDes) system. One effective means of equalizing channel loss and negating the impact of ISI is to use a DFE in the SerDes receiver. However, commonly employed 8b/10b encoded data introduces significant internal data correlations which may negatively impact the DFE adaptation in a SerDes device. The data correlations in the 8b/10b encoded signals result in the determination of DFE taps that are adapted to incorrect values, thereby reducing the link performance, particularly on longer links.

DFE tap adaptation in a SerDes device in accordance with the prior art is accomplished by computing the correlation between received ones and zeros of an encoded input signal and the state of an error sampler located at the median point of the upper or lower SerDes eye diagram. Traditionally, error samplers are provided in any SerDes receiver to make various measurements within the receiver. While, data samplers are used to sample the input signal, they cannot be moved from their ideal location because they are sampling the incoming data stream to provide real data to the Protocol Processing Layer (PPL) and no errors can be tolerated on the data samplers. Accordingly, error samplers are used to make the various measurements.

As shown in FIG. 1, a SerDes eye diagram provides an overlay of many state transitions for a given differential pair in the SerDes receiver. With reference to FIG. 1, in order to sample an encoded input signal at the receiver, a data sampler 105 is positioned at the center of the nominal SerDes receiver eye diagram 100. During each sampling period, the data sampler 105 converts the analog encoded input signal to either a one, if the sample is above the sampler level, or to a zero, if the sample is below the sampler level. As such, the data sampler 105 samples the input signal to provide a plurality of data samples and a shift register 120 is positioned to collect the data samples as they are provided by the data sampler 105.

In the context of DFE adaptation, the error samplers are located at the median amplitude location within the upper eye 110 or the median amplitude location within the lower eye 115, following DFE correction. While two physical error samplers could be used in parallel, where one is placed at the median amplitude location within the upper eye 110 and another is placed at the median amplitude location within the lower eye 115, typically the error sampling is performed serially, utilizing only one physical error sampler. In the following discussion, the median amplitude location within the upper eye 110 is referenced for simplicity. However, the same discussion also applies to the median amplitude location within the lower eye 115.

If there is no ISI introduced by the channel, then the upper eye would have no amplitude, that is, the distance between the inner upper eye (IUE) 125 and the outer upper eye (OUE) 130 would be zero. In a typical receiver, there is an amplitude difference between these two levels and the more ISI introduced by the channel, the wider the difference between IUE 125 and OUE 130. When the error sampler is positioned at the median amplitude location within the upper eye 110, then half of the samples that pass through the upper eye are sampled as 1's by the error sampler and half of the samples are sampled as 0's. As such, at the median amplitude point, the error sampler will read exactly 50% ones and 50% zeroes, so it as at the center of the upper eye 110. A similar arrangement may be utilized for the median amplitude location within the lower eye 115.

The location of the error sampler is determined utilizing a search procedure, such as a linear or binary search. Once the error sampler is located at the median position, it can then be used to measure the channel ISI resulting from a particular previously received bit, which is related to a particular tap within the DFE. The previously received data samples are collected by the shift register 120 so that they can be compared to a current error sample to determine the channel ISI.

During DFE adaptation, a correlation count is maintained between the previously collected data samples (Dn) and a current error sample (E0). The correlation counters that are responsible for maintaining the correlation count will count up if the previously collected data sample matches the current error sample (Dn=E0) and will count down if the previously collected data sample does not match to the present error sample (Dn!=E0). Over time, the impact of ISI is evident, wherein the correlation counters are large and positive (positive correlation), close to zero (un-correlated) or large and negative (negative correlation).

In an exemplary DFE tap adaptation, for each DFE distance (1 ... N), a correlation counter is maintained. The correlation counter is initialized to zero at the start of a DFE tap adaptation period, during which a plurality of samples (Q) are collected. For a predetermined number of samples, each of the correlation counters count up or down for each received data sample, wherein the correlation counter counts up if the previously collected data sample matches the current error sample and the correlation counter counts down if the previously collected data sample does not match the current error sample. Following the predetermined number of up/down correlation counter operations, the correlation count maintained for each of the DFE taps is checked to determine if the input signal exhibits correlation. A correlation count of zero indicates that the channel ISI is not correlated to the DFE tap associated with the data sample. In a particular embodiment, if the correlation count is greater than zero for a particular DFE tap, then it is determined that the data is correlated and the DFE tap weight should be increased. Alternatively, if the correlation count is less than zero, then it is determined that the data is anti-correlated and the DFE tap weight should be decreased. After the DFE tap weights are adjusted, the correlation counters are reset to zero and the process continues for another predetermined number of samples, after which correlation is again checked and the tap weights are updated accordingly to achieve adaptation of the DFE tap. The predetermined number of samples may typically be 100s to 1000s of samples to provide a statistically significant result. After each DFE tap update, the correlation counters are reset, the median amplitude is recalculated, and the sampling procedure and measurements are repeated.

In determining if the median amplitude location within the upper eye 110 or the median amplitude location within the lower eye 115 should be used to adapt the DFE tap weights, the output value of the data sampler 105 is analyzed. If the output value of the data sampler 105 is equal to one, then it is evident that the received value has passed through the median amplitude location within the upper eye 110, while if the output value of the data sampler 105 is equal to zero, then it is evident that the received value has passed through the median amplitude location within the lower eye 115. When error samplers are implemented serially, the value of the output data validates the operation. For example, if the error sampler is positioned only at the median amplitude location within the upper eye 110, then the correlation counts are only updated if the output data of the previous bit is equal to one, otherwise the correlation counts are not updated.

As such, the process of DFE tap adaptation identifies the tap weights for the DFE using correlation counts based upon previously collected data samples and current error samples. DFE tap weights are adapted to be effective in eliminating the channel ISI from the input signal before the data sampler converts the input signal to a digital signal.

Figure 2:
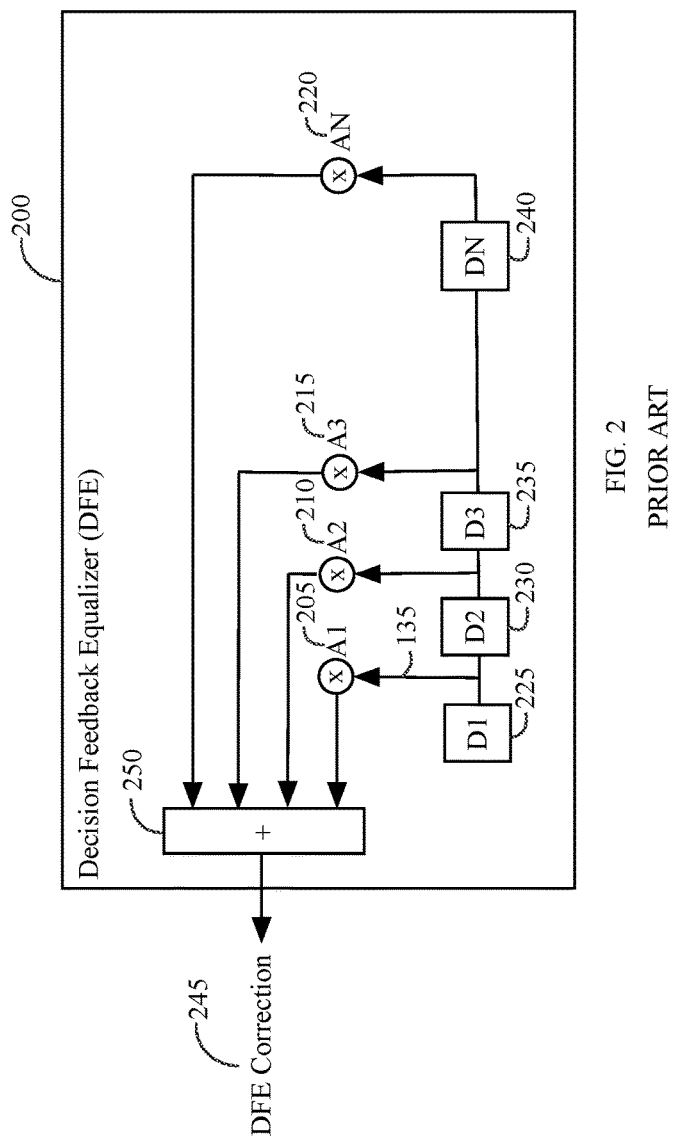
FIG. 2 is a block diagram a DFE, in accordance with the prior art.

With reference to FIG. 2, a decision feedback equalizer (DFE) filter 200 of the prior art equalizes channel ISI by multiplying previously received data samples (D1 ... DN) 225, 230, 235, 240 by the one or more DFE tap weights (A1 ... AN) 205, 210, 215, 220 and then subtracting this weighted value from the received signal at a summing amplifier 250 to produce a DFE correction voltage 245. The previously described process of DFE tap adaptation identifies the coefficient weights 205, 210, 215, 220 (A1 ... AN) so that the channel ISI is correctly removed from the input signal, before the data sampler converts the present input signal to a digital signal (1's and 0's). The DFE correction voltage 245 is subtracted from the input signal voltage to correct for ISI from the previously received data samples (D1 ... DN) 225, 230, 235, 240.

As such, each DFE tap weight (A1 ... AN) 205, 210, 215, 220 is an estimation of the ISI contribution from the corresponding bit. The goal of DFE tap adaptation is to remove any correlation between the previous sample and the current sample. As such, the DFE tap weights (A1 ... AN) 205, 210, 215, 220 are correctly set if the current error sampler output is uncorrelated with the previous data sample.

The goal of DFE tap adaptation is to remove any correlation between previously collected data samples and a current error sample. The process of DFE adaptation finds the tap weights so that channel ISI is correctly removed before the data sampler converts the input signal to digital 1's and 0's. As such, a DFE tap weight is considered to be correctly set if the error sampler output is uncorrelated with the previously collected data samples. The filtering of the ISI induced correlation proves to be effective unless the data is correlated with itself. In the current state of the art, the DFE taps are adjusted based upon all of the pairs of error samples and data samples collected from the input signal. As such, in the current state of the art, the DFE taps are adapted to remove any data-dependent correlations present in the input signal, in addition to the ISI induced correlations. Adapting the DFE taps using pairs of data samples and error samples that exhibit data-dependent correlation leads to improper DFE adaptation, which results in inferior operation of the SerDes receiver.

Transmission encoding techniques, such as 8b/10b, are commonly known in the art for converting a byte wide data stream of random ones and zeroes into a DC balanced stream of ones and zeroes. 8b/10b coding is commonly used in serial communication protocols and standards employing embedded clock and control information, such as found in SerDes devices for communication applications. However, 8b/10b encoded data exhibits significant internal data correlations, which may negatively impact the DFE adaptation in the SerDes design.

As previously discussed, a key requirement for DFE tap weight adaptation to be successful in overcoming channel ISI is that the received data itself must be un-correlated. If the data in the input signal is correlated, the data correlation(s) will alter the statistics gathered regarding the DFE tap weights, thereby resulting in poorly adapted DFE taps which reduces the SerDes receiver performance. As such, the data correlation inherent in the 8b/10b encoded data causes the DFE tap weights to adapt to incorrect values, thereby reducing the performance of the communication link through, inter-alia, high power consumption, lower link margin, lower supported link distance.

The present invention addresses the negative effect that correlation in the encoded data has on the DFE tap adaptation process. In various embodiments, the system and method of the present invention performs DFE tap adaptation only using pairs of data samples and error samples of an input signal that are known to be uncorrelated with each other based upon their location in the input signal. As such, if a pair of data samples and error samples has no encoding-dependent correlation, then any measured correlation is due to ISI induced by the channel, which can be corrected by the DFE.

The following detailed description of the invention will be focused on 8b/10b encoding, however, this is not intended to be limiting and other encoding techniques which result in data correlation within an encoded symbol are within the scope of the present invention.

While it is known that data correlation between different bits of a given 8b/10b symbol may be significant, data correlations between bits of different symbols in the input data stream are small enough that the 8b/10b encoding correlations do not negatively impact the DFE tap adaptation process. As such, in one embodiment of the present invention, data samples and error samples taken from the input signal are aligned to establish pairs of data samples and error samples in which the data sample and the error sample are from different encoded symbols of the input signal. The DFE taps are then adapted using the pairs of samples that are free from encoded data related correlations.

For example, in the case of an input signal to the DFE that is 8b/10b encoded, the number of error samples is reduced to 1 bit out of every 10 bits of received information from the input signal, i.e. 1 bit per 10-bit symbol, and the error samples are appropriately aligned to ensure that the pairs of samples used for the DFE adaptation are free from encoded data related correlations. In one embodiment, after sampling the input signal comprising a serial bit stream of encoded symbols, the error samples and the data samples are aligned such that the current error sample is from a current 8b/10b encoded symbol, while all the data samples being compared to the current error sample are from a previous 8b/10b encoded symbol. The impact of previously collected data samples on the current error sample are referred to as post-cursor ISI. The DFE corrects for post-cursor ISI.

For some additional receiver functions, it may also be useful to obtain pre-cursor correlation information which describes the impact of future data bits on the current bit. Typically, only the first one or two pre-cursor bits are collected from the input signal because the pre-cursor tends to be fairly short due to the low-pass nature of the channels being used and typically the only bits of interest are the first two bits of the pre-cursor. A different error sample would be used for pre-cursor correlation measurements, again with the goal of placing the error sample in one bit of the current 8b/10b symbol and collecting all of the data samples from a subsequent 8b/10b symbol.

Figure 3:
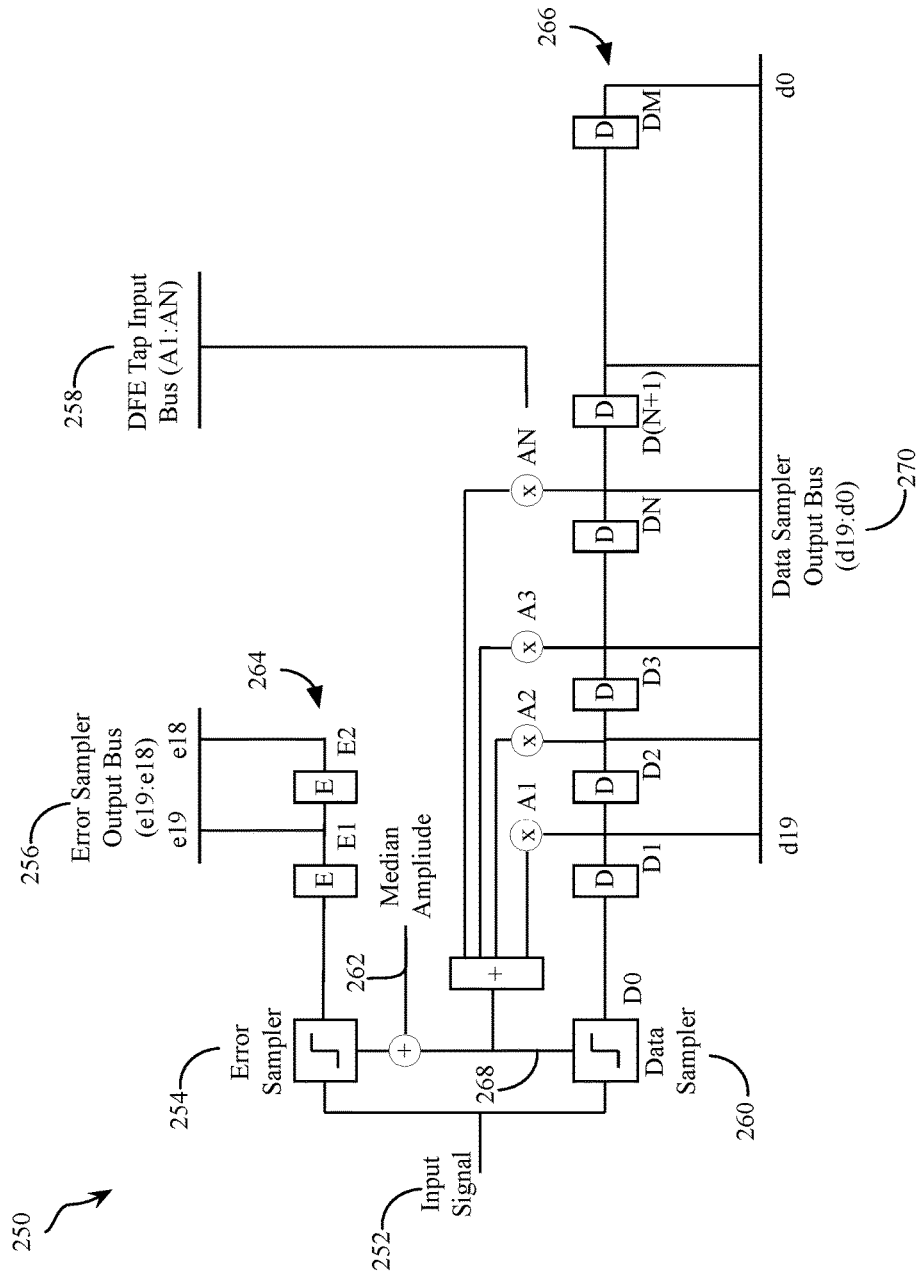
FIG. 3 is a diagram illustrating the operation of the DFE, in accordance with an embodiment of the present invention.

With reference to FIG. 3, an exemplary operation of an 8b/10b SerDes receiver 250 is illustrated. As shown, an input signal 252 comprising a serial bit stream of 8b/10b encoded symbols is received at the error sampler 254 and the data sampler 260. A symbol in this context is one 10-bit group of bits that were received, serially, and were encoded together in the 8b/10b format.

The data sampler 260 and the error sampler 254 take samples of the input signal by performing an analog to digital conversion once every data period, commonly referred to as a unit interval (UI). As previously discussed, the error sampler 254 is located at the median amplitude 262 within the upper or lower eye. For example, in the case of an SAS3 protocol, the serial bit stream is sent at 12 Giga bits-per-second, or one data bit every 83.3 ps (pico second). The samplers then provide an analog to digital conversion once every 83.3 ps. The samplers provide a high-speed serial data stream of 1s and 0s to a deserializer that converts the high-speed serial data stream to a parallel bus format, having a reasonable clock frequency, for further processing.

Referring again to FIG. 3, in the present invention, the DFE correction voltage 268 is provided as a reference voltage at one input to the data sampler 260 and the other input to the data sampler 260 is the sampled input signal 252, which may have been previously filtered by a front-end filtering block. The data sampler 260 is realized as a comparator for comparing the input signal 252 to the DFE correction voltage 268 and for determining if the input signal sample is above the reference voltage (DFE correction voltage 268). If the input signal 252 sample is above the DFE correction voltage 268, the data sampler 260 provides a digital "1" at the output. If the input signal 252 sample is below the DFE correction voltage 268, the data sampler 260 provides a digital "0" at the output. The outputs (D1-DM) from the data sampler 260 are provided to a data sample shift register 266 that is M bits long. D1 to DM are the serially sampled bits from the input signal, where D1 is the most recently sampled bit and DM is the oldest samples bit. In this exemplary embodiment, the data sample shift register 266 is 20 bits long. The first 8 data samples of the data sample shift register 266 are then tapped and connected to multipliers A1 through AN 258 (DFE tap input bus A1:AN), and when summed together create the DFE correction voltage 268.

All of the M samples of the data sample shift register 266 are connected to the data sampler output bus 270. The data sampler output bus 270 is connected to the deserializer of a physical media attachment (PMA) layer, which samples the M samples of the data sample shift register 266 once every 20 unit interval to create the data sampler output data bus 270 (d19:d0).

The error sampler 254 uses the same reference voltage 268 (DFE correction voltage), but with an additional median amplitude 262 added to the reference voltage level 268. As previously described, with reference to FIG. 1, an error sampler positioned at the median amplitude location within the upper or lower eye provides this median amplitude level 262 as a fixed amplitude signal correction. The error sampler 254 samples the input signal 252 and provides its output to an error sample shift register 264. In this particular embodiment, two flip-flop circuits are implemented in the error sample shift register 264 because, for 8b/10b encoding, the present invention utilizes only one error sample for every 10 data samples when adapting the DFE tap weights.

Figure 4:
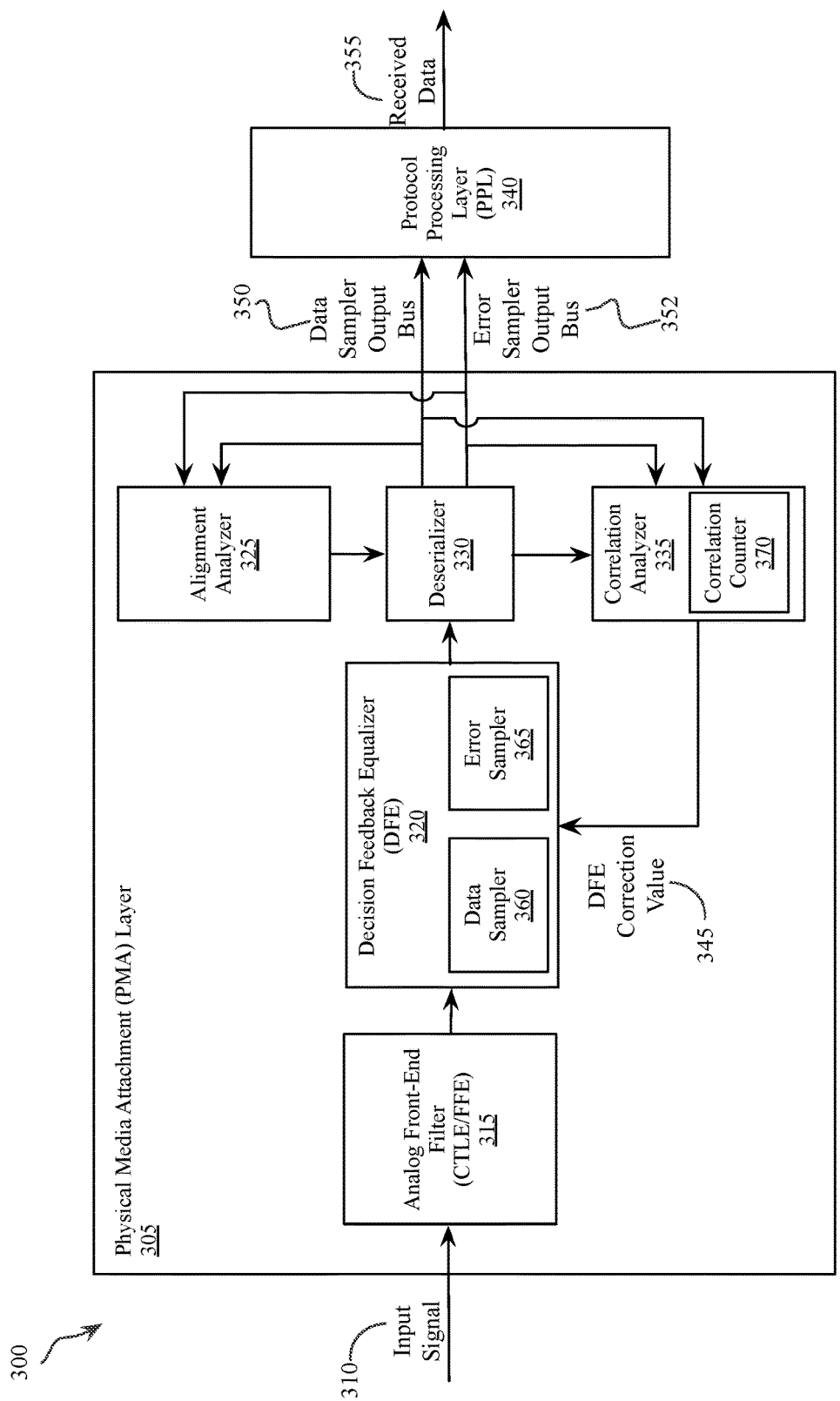
FIG. 4 is a block diagram of an 8b/10b correlation immune SerDes receiver, in accordance with an embodiment of the present invention.

With reference to FIG. 4, in one embodiment of the present invention, an exemplary 8b/10b SerDes receiver 300 is provided. Implemented in the PMA layer 305 of the SerDes receiver 300, the receiver may include an analog front-end filter 315, a DFE 320 coupled to an output of the analog front-end filter 315, a deserializer 330 coupled to an output of the DFE 320, an alignment analyzer 325 providing an input to the deserializer 330 and a correlation analyzer 335 coupled to a respective output of the deserializer 330 and coupled in a feedback loop with the DFE 320. The SerDes receiver 300 may further include, a protocol processing layer (PPL) 340 to provide the received data 355 based upon the data sampler output bus 350 from the PMA layer 305 represented by a respective output of the deserializer 330. The PMA layer 305 is known for performing various tasks in a SerDes device, including, clock recovery, detection and eye measurement and signal detection.

In operation, the received input signal 310 is passed through the analog front-end filter 315 of the PMA layer 305. The input signal 310 filtering operation may be implemented in several ways, which may include a continuous time linear equalizer (CTLE) and a feed forward equalizer (FFE) to provide finite impulse response filtering (FIR) for the SerDes receiver 300.

After the input signal 310 is filtered by the analog front-end filter 315, the next step performed by the SerDes receiver 300 is decision feedback equalization, where decisions made on previously received bits are combined with DFE coefficients (or tap weights) to remove additional ISI. As such, the DFE 320 may include one or more taps that are adapted to remove the intersymbol interference (ISI) from the input signal 310, wherein the input signal 310 includes a serial data stream of 8b/10b encoded symbols. The fully equalized signal is then sampled and passed to the deserializer 330 which generates a parallel stream of output data on the data sampler output bus 350. The DFE 320 may include, a data sampler 360 for sampling the input signal 310 to provide data samples and an error sampler 365 for sampling the input signal 310 to provide error samples, as previously described with reference to FIG. 3.

The present invention includes an alignment analyzer 325 for analyzing the input signal 310 and aligning the data samples and error samples to establish a plurality of pairs of data samples and error samples that are from locations in the serial bit stream of encoded symbols that are known to be uncorrelated with each other. In operation of the alignment analyzer 325, the required alignment of the data samples and the error samples can be accomplished by monitoring the input signal 310 and detecting the comma characters that are known to be regularly transmitted on the 8b/10b link. Alternatively, alignment of the input signal 310 can be accomplished by observing the di-bit correlation properties of the received input signal 310.

In one embodiment, for an input signal comprising 8b/10b encoded symbols, the alignment analyzer 325 aligns the data samples and the error samples such that the data samples and the error samples of each of the plurality of pairs of data samples and error samples used for DFE adaptation are taken from different 8b/10b symbols.

In an additional embodiment, it is also possible to use two different portions of the 8b/10b symbol to accomplish the necessary alignment of the input signal 310, wherein one alignment is accomplished at the 10-bit symbol boundary and another alignment is accomplished at the 6 bit/4 bit symbol boundary. Since each 8b/10b symbol comprises a 5b/6b (5 input bit, 6 output bit) portion and a 3b/4b (3 input bit, 4 output bit) portion, the internal 6 bit/4 bit boundary could be used as a second reasonable correlation point or alternatively, could be used instead of, or in addition to, the original alignment. The internal 6 bit/4 bit boundary of the 8b/10b symbols could be used to properly position the error samplers and the data samples in different 8b/10b symbols.

The correlation analyzer 335 coupled to the DFE 320 receives input from the data sampler output bus 350 and the error sampler output bus 352. The correlation analyzer 335 includes a correlation counter 370 for maintaining a correlation count between the data sample and error sample in each of the plurality of pairs of data samples and error samples, wherein the data sample and error sample in each of the plurality of pairs of data samples and error samples are from locations in the serial bit stream of encoded symbols that are known to be uncorrelated with each other. As such, during DFE adaptation, the correlation analyzer 335 of the present invention is modified to use the results of the correlation count for pairs of data samples and error samples that are known to be free from 8b/10b internal symbol correlations issues, as determined by their location in the serial bit stream. Accordingly, the correlation analyzer 335 provides a DFE correction value 345 to the DFE to adjust the tap weight one or more taps of the decision feedback equalizer (DFE) 320 utilizing a correlation analysis that is based only on channel induced ISI which is free from internal correlation related to the encoded symbols. The operation of the correlation analyzer 335 is to accumulate correlation information for each DFE 320 tap relative to the plurality of pairs of data samples and error samples and to periodically update the DFE 320 tap weights according to the results of the correlation analysis. As previously described, the correlation analyzer 335 adapts the DFE tap weights to correct for post-cursor ISI and the correlation analyzer 335 feeds the DFE correction value 345 back to the DFE 320, thereby adjusting one or more tap weights of the one or more DFE taps of the decision feedback equalizer (DFE) based upon the correlation count between the plurality of pairs of data samples collected by the data sampler 360 and error samples collected by the error sampler 360. In a specific embodiment, the tap weight of the DFE taps may be increased if the correlation count indicates that the data samples are correlated and the tap weight of the DFE taps may be decreased if the correlation count indicates that the data samples are anti-correlated.

After the DFE 320 removes the ISI from the input signal 310, using the DFE tap weights adjusted based upon the DFE correction voltage 345, the equalized input signal is then provided to the deserializer 330 which then samples the equalized input signal to recover the data transmitted on the input signal 310. The data from the deserializer 330 may then be provided as output data on a data sampler output bus 350 from the PMA layer 305 to a protocol processing layer (PPL) 340 for further processing to recover and output the received data 355.

In the present invention, the data sampler output bus 350 bus width from the SerDes receiver to the remainder of the system should preferably be a multiple of the symbol size of the encoded symbols of the input signal. In the case of 8b/10b encoding, the symbol size is 10 bits and as such, the data sampler output bus 350 should preferably be a multiple of 10 bits, thereby allowing for the symbol alignment of the 8b/10b input signal 310 to remain unchanged over time. If the data sampler output bus 350 width is not a multiple of 10 bits, then on some clock cycles the error sampler 365 will not be in a different symbol from all the sampled data values, resulting in correlated data being introduced into the DFE 320 tap adaptation process. Any use of correlated data in the DFE 320 tap adaptation process will damage the correlation statistics for measuring channel ISI and will impact DFE 320 convergence.

Figure 5:
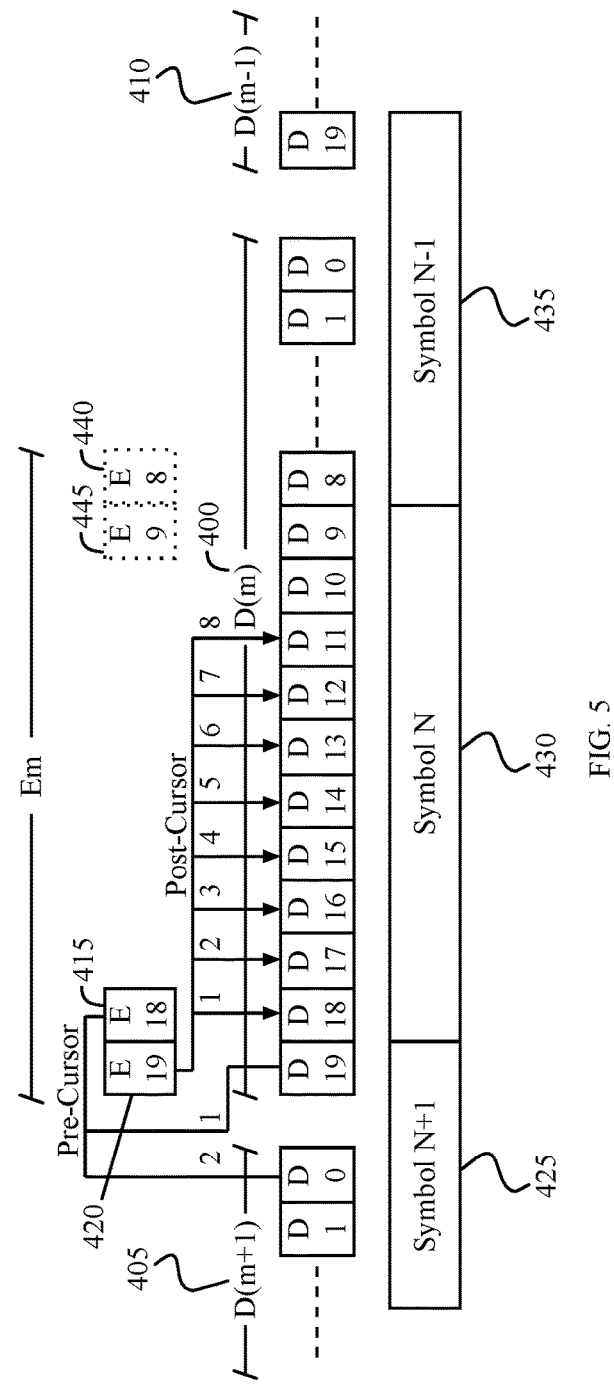
FIG. 5 is a diagram illustrating a desired error sampler alignment vs. an input signal comprising 8b/10b symbols, in accordance with an embodiment of the present invention.

FIG. 5 illustrates a desired error sampler alignment relative to the 8b/10b symbols of an input signal. In this illustration, the D(m) 400, D(m+1) 405 and D(m−1) 410 represent the 20-bit data sampler output bus 350 from the PMA layer 305 at times m, m−1 and m+1. The 20-bit data sample output bus includes data samples taken from the input signal comprising a serial bit stream of 8b/10b encoded symbols. Symbol N+1 425, Symbol N 430 and Symbol N−1 435 represent the 10-bit 8b/10b encoded symbols of the input signal 310. In FIG. 5 there are two error samplers, one at bit 19 (E19) 420 and another at bit 18 (E18) 415 of D(m) 400. The alignment of the 20-bit data sample output bus D(m) 400 relative to Symbol N 430 is illustrated, wherein error sample E19 420 is aligned with Symbol N+1 425 and data samples 11-18 of D(m) 400, which are to be compared to E19 420, are aligned with Symbol N 430. Accordingly, the alignment establishes pairs of error samples and data samples that are aligned within different symbols of the input signal and as such, the pairs of error samples and data samples used for DFE adaptation are from locations in the input signal that are known to be uncorrelated.

Assuming that the DFE is an 8-bit DFE, eight correlation counters will be maintained to provide for DFE adaptation. For error sample E19 420, the first post-cursor data sample is D18, the $2^{nd}$ post-cursor data sample is D17, and continuing down to the 8th post-cursor data sample located at D11. In this embodiment, since the encoded symbols are 8b/10b symbols, the DFE is an 8-tap DFE which includes 8 post-cursor values. Considering error sample E19 420 which is aligned with Symbol N+1 425, the pairs of data samples and error samples would be comprised of E19 420 and one of eight data samples from D(m) 400, D18-D11, which are aligned with Symbol N 430. The first correlation counter will be for a first pair, D18 vs. E19, which represents the first post-cursor value, all the way down to the eighth pair, D11 vs. E19, which represents the $8^{th}$ post-cursor value.

To perform DFE adaptation, post-cursor correlations are taken between error sampler E19 420 and data samples D18, D17 . . . D11. These post-cursor correlations are used to adapt the DFE tap weights, as previously described. As shown, E18 415 and D18 of D(m) 400 are aligned with the last bit of Symbol N 430. D19 of D(m) 400 and E19 420 are aligned with the first bit of Symbol N+1 425. Bits D18-D9 of D(m) 400 are aligned with Symbol N 430 and bits D8-D0 of D(m) 400 are aligned with Symbol N−1 435. No post-cursor correlations from error sampler E18 415 can be considered because to do so, E18 415 would have to be compared to D17, D16 . . . D10 of D(m) 400, but then the error sample (E18) and the data samples (D17-D10) would be from the same 8b/10b symbol, Symbol N 430. With both the error samples and the data samples in the same 8b/10b symbol undesirable data correlations would be included in the DFE adaptation, which is what the present invention seeks to avoid. Many known SerDes receivers maintain a plurality of error samplers and may include up to one error sampler for every received data bit. However, most of the correlation sources provided by the additional error samplers would be tainted by the 8b/10b correlations because the error sample and the data samples would not be taken from different 8b/10b symbols.

If pre-cursor values are to be considered, error sampler E18 415, which is aligned with the last bit of Symbol N 430, can be used to compare against D19 of D(m) 400 and D0 of D(m+1) 405, which are both aligned with symbol N+1 425, thereby insuring that the error sampler E18 415 is from a different 8b/10b symbol when compared to the data samples because E18 415 exists in Symbol N 430 and the data samples D19 and D0 exist is Symbol N+1 425.

Additionally, error sampler E9 445 could also be used to collect post-cursor DFE correlation information. Since E9 445 also straddles an 8b/10b symbol boundary, E9 445, which is aligned with the first bit of Symbol N 430, could be used for comparison to data samples D8-D1 of D(m) 400, which are aligned with Symbol N−1 435, to collect post-cursor DFE correlation information. Additionally, E8 440, which is aligned with the last bit of Symbol N−1 435 could be used for comparison to data sample D9 and D10 of D(m) 400 for pre-cursor information. Including these additional error samplers E9 445 and E8 440 would result in faster correlation convergence but would also require additional hardware cost.

After the alignment analyzer 325 has determined the required alignment for the data samples and the error samples, the alignment analyzer 325 provides the alignment to the correlation analyzer 335, thereby ensuring that the correlation analyzer 335 maintains correlation counters for data samples from a different 8b/10b encoded symbol than the error samples. The alignment analyzer 325 may additionally communicate the alignment with the deserializer 330 and the deserializer 330 may then drop one or more bits of the input signal 310, to accomplish the input signal 310 alignment determined by the alignment analyzer 325.

The deserializer 330 may implement a skip function to accomplish the necessary alignment. Normally, in the case of an 8b/10b encoding, the deserializer 330 samples the output bus of the DFE 320 once every 20 clock cycles. To skip a bit on the input signal 310, the deserializer 330 samples the output bus of the DFE 320 once in 21 clock cycles, instead of the usual 20 clock cycles. This effectively means that one bit is lost at the PMA layer 305 output, which thus effectively shifts the PMA layer output alignment relative to the 8b/10b symbols.

In one embodiment, the alignment analyzer 325 receives input from the data sampler output bus 350 and the error sampler output bus 352. The alignment analyzer 325 identifies one or more comma characters in the plurality of encoded symbols of the input signal 310 and then determines an alignment of the data samples and the error samples to establish a plurality of pairs of data samples and error samples, wherein the data sample and error sample of each of the plurality of pairs of data samples and error samples are from locations in the serial bit stream of encoded symbols that are known to be uncorrelated with each other.

In comma character alignment, comma characters in an 8b/10b encoded signal are K28.1, K28.5 and K28.7, as shown in Table I.

TABLE 1

| 8b/10b Encoding of Comma characters | | | |
|---|---|---|---|
| Symbol | Source Bits | First Variant (Positive Disparity) | Second Variant (Negative Disparity) |
| | HGF EDCBA | abcdei fghj | abcdei fghj |
| K.28.1 | 001 11100 | 001111 1001 | 110000 0110 |
| K.28.5 | 101 11100 | 001111 1010 | 110000 0101 |
| K.28.7 | 111 11100 | 001111 1000 | 110000 0111 |

Each comma character may have two different variants and the comma characters are regularly sent on any 8b/10b link, to specifically aid in symbol synchronization. Once the necessary alignment has been determined by the alignment analyzer 325, then the alignment of bits at the error sampler of the DFE 320 is in one embodiment altered by dropping bits from the input signal 310 until the desired alignment is obtained.

Figure 6:
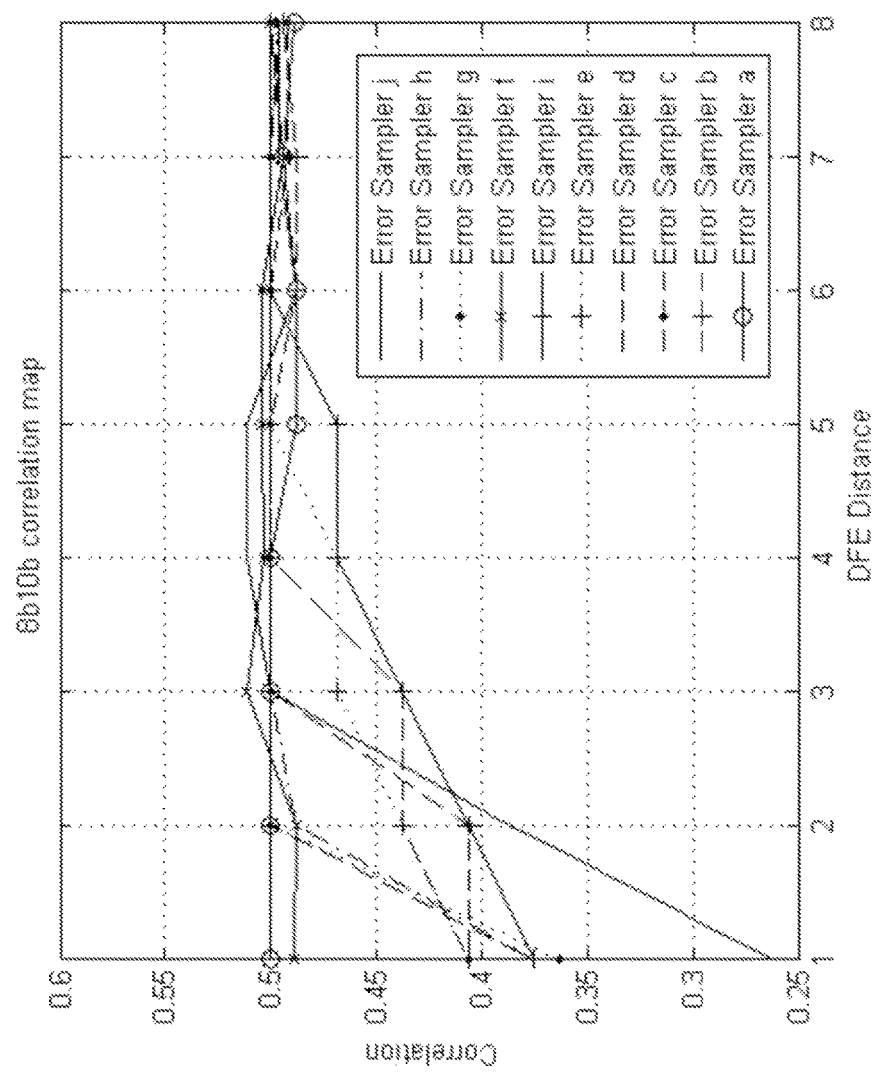
FIG. 6 is a graphical illustration of 8b/10b bit-to-bit correlations used for alignment of the input signal, in accordance with an embodiment of the present invention.

In an alternative embodiment, the alignment analyzer 325 utilizes di-bit correlation to accomplish the necessary alignment of the input signal 310. In di-bit correlation alignment, the correlation properties of all the 8b/10b symbols and in particular, the correlation properties of bit-pairs within the symbol are analyzed. FIG. 6 provides a graphical illustration of 10 plots wherein bit "n" of an 8b/10b symbol is used as the starting bit and each plotted line represents the expected correlation between bit "n" and bit "n+q" in an 8b/10b data stream. A correlation value of 0.5 indicates completely random correlation, so that knowing the value of bit "n" provides no information regarding the value of bit "n+q". A correlation value greater than 0.5 indicates that the two bits, "n" and "n+q", are correlated and a value less than 0.5 indicates that bits "n" and "n+q" are anti-correlated. The correlation value indicates the probability that bit "n+q" is the same as bit "n". For example, a correlation value of 0.4 means that there is a 40% chance that bits "n" and "n+q" are the same (anti-correlated), while a correlation value of 0.6 means that there is a 60% change that bits "n" and "n+q" are the same (correlated). In general, di-bit correlation values between 48% and 52% would be considered acceptable for DFE adaptation, while values between 45% and 48% should be avoided and any value below 45% must be avoided. Additionally, di-bit anti-correlation values between 48% and 52% would be considered acceptable for DFE adaptation, while values between 52% and 55% should be avoided and any value above 55% must be avoided FIG. 6 illustrates the data correlations that would occur when the error sampler is at one of 10 possible locations (a-j) in the 8b/10b symbol.

As shown, a first uncorrelated location, wherein the correlation is about 50%, occurs for Error Sampler a, which corresponds to bit 9 of the 8b/10b symbol. This is to be expected since bit 9 is at the symbol boundary between Symbol N 430 and Symbol N−1 435.

A second uncorrelated location occurs 6 bits later, at Error Sampler f. The second uncorrelated location results from the way in which 8b/10b symbols are constructed, wherein each 8b/10b word is made up of a 5b/6b (5 input bit, 6 output bits) portion and a separate 3b/4b (3 input bits, 4 output bits) portion.

Referring to FIG. 5, Symbol N 430 comprises bits 18:9 at the PMA layer 305 output and the mapping of these bits to the 8b/10b symbol bits is:

| 18 | 17 | 16 | 15 | 14 | 13 | 12 | 11 | 10 | 9 |
|----|----|----|----|----|----|----|----|----|---|
| j  | h  | g  | f  | i  | e  | d  | c  | b  | a |

Each 8b/10b symbol is made up of a 5b/6b (5 input bit, 6 output bits) portion and a separate 3b/4b (3 input bits, 4 output bits) portion. According to this mapping, bits 18:15 are part of the 3b/4b portion of the 8b/10b symbol and bits 14:9 are part of the 5b/6b portion of the 8b/10b symbol. Since the 6b/4b boundary is between bits 15 and 14, error samplers at E15 and E14 could be used in a similar way to E19 and E18 as previously described with reference to FIG. 5.

In one embodiment, the alignment analyzer 325 of in the PMA layer 305 of the SerDes receiver performs di-bit alignment determination by maintaining 10 different correlation counters 370 in correlation analyzer 335, where each correlation counter 370 represents a running correlation between bits "n" and "n+1" summed together with the correlation between bits "n+6" and "n+7". The 10 correlation counters 370 then increment whenever a given pair of bits is equal and decrement whenever a given pair of bits is not equal. The 10 correlation counters 370 each continue counting until a terminal count value is reached. As each correlation counter 370 reaches the terminal count value, that correlation counter 370 is halted, since it has been determined that the particular bit being monitored by that particular correlation counter 370 exhibits strong correlation or anti-correlation properties. The last correlation counter 370 to continue running effectively identifies the 8b/10b symbol boundaries used for alignment of the input signal 310 at the receiver.

One advantage of the di-bit correlation alignment method is that it can be run on any 8b/10b data stream and does not rely on protocol layer recovery to have already been performed. In many 8b/10b standards, there is a training period in place before the standard 8b/10b traffic begins running, which includes the comma characters. In such cases, it is desirable that the PMA output alignment process be completed while the SerDes link is initializing to allow for robust receiver adaptation and correct transmitter emphasis training to be accomplished.

Figure 7A:
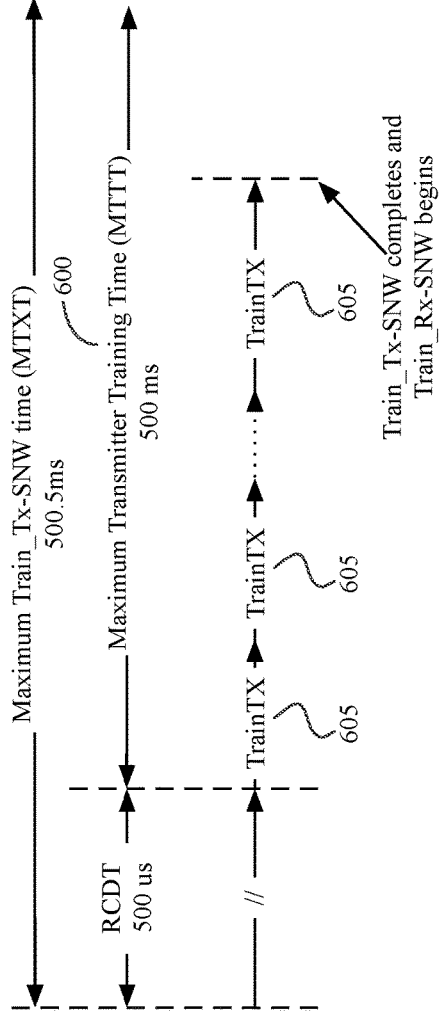
FIG. 7A is a diagram illustrating the SAS3 protocol steps followed during initial system training of the SerDes receiver in accordance with an embodiment of the present invention.
Figure 7B:
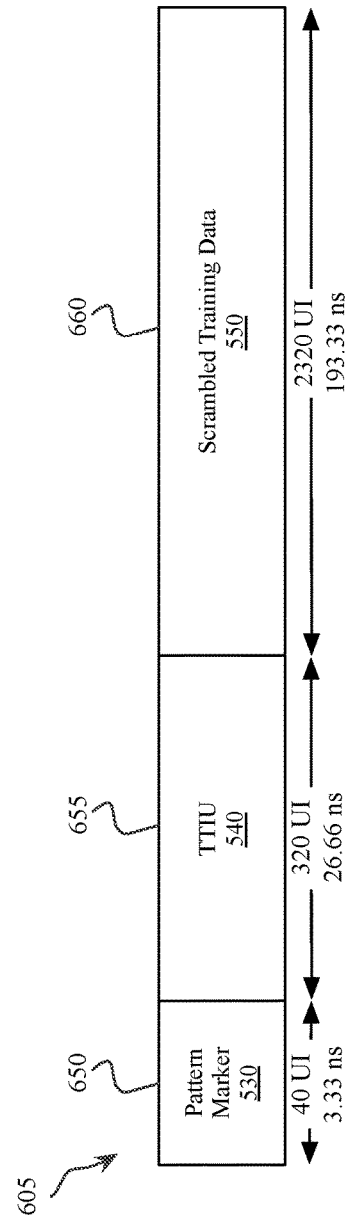
FIG. 7B is a diagram illustrating a training sequence (Train_Tx) used during initial system training of the SerDes receiver, in accordance with an embodiment of the present invention.

As an exemplary embodiment, the di-bit alignment method performed by the alignment analyzer 325 is applied to the case of an SAS-3 (Serial Attached SCSI) transmission protocol, as shown with reference to FIG. 7A and FIG. 7B.

FIG. 7A illustrates the SAS-3 protocol steps executed during the initial system training. It is preferred that during the transmission training phase of the SAS-3 protocol negotiation that the receiver DFE taps settle to their ideal states, so that the transmitter training process can determine the optimal transmit emphasis filter settings. As shown in FIG. 7A, in this exemplary embodiment, an SAS-3 receiver has a maximum transmitter training time (MTTT) 600 of 500 ms to successfully train the transmit emphasis filter. During the maximum transmitter training time (MTTT), a "TrainTx" pattern 605 is repeated until either the training period successfully completes or the maximum transmitter training time (MTTT) 600 has been reached.

The "TrainTx" pattern 605 is shown in FIG. 7B, wherein the pattern comprises a pattern marker of 40 UI (Unit Intervals) 650, a Transmitter Training Information Unit (TTIU) 655 portion containing 320 UI and a scrambled training data portion 660 containing 2320 UI. The scrambled training data portion 660 comprises 232 8b/10b symbols.

A method for performing 8b/10b alignment for the SAS-3 protocol includes, first identifying the pattern marker 650 in the training pattern 605 and then skipping over sufficient UI to enter the scrambled training data portion 660 of the training signal 605. Di-bit correlations statistics are collected during the scrambled training data portion 660. These steps are repeated several times until the 8b/10b alignment is determined. Following the determination of the 8b/10b alignment using the di-bit correlation statistics, the alignment of the PMA of the SerDes receiver is changed so that the ideal alignment is exhibited at the PMA output.

With reference again to FIG. 4, an improved SerDes receiver 300 is provided which includes an alignment analyzer 325 to determine the symbol alignment boundaries on the input data 310. The alignment analyzer 325 may accomplish the required alignment using either comma character alignment or di-bit correlation alignment, as previous described. In addition, the deserializer 330 is coupled to the alignment analyzer 325 and is configured to support a "skip" alignment adjustment input signal, wherein the deserializer 330 drops one bit (any bit) from the input signal 310 whenever "skip" is activated by the alignment analyzer 325 to allow for an output symbol alignment to be changed. The use of a "skip" alignment adjustment technique is not intended to be limiting and other known alignment adjustments method are within the scope of the present invention. To maintain the necessary alignment the bus width of the data sampler output bus 350 is preferably an integer multiple of the number of bits in the encoded symbol, thereby forcing the symbol alignment to remain unchanged over time. Additionally, the correlation analyzer 335 is updated by the alignment analyzer 325 to support only those connections which are known to be free from the encoded symbol internal correlation issue, such as the connection illustrated in FIG. 5

In the specific embodiment of the invention wherein the input signal comprises a serial bit stream of 8b/10b encoded symbols, the data sampler output bus 350 from the PMA layer 305 is 20-bits wide. The error samples and the data samples are aligned such that the error sampler output bus 352 from the PMA layer is only 2-bits wide. As such, in the present invention the error bits used for the DFE adaptation are the 2-bits aligned with the 20-bit wide data sampler output bus 350 that are known to be uncorrelated, based upon their location in the 8b/10b symbol. In an alternative embodiment, all 20-bits of the error samples could have been collected in the error sampler shift register 264 and an additional digital block could have been used to identify the pairs of data samples and error samples which should be used in the DFE adaptation, however such an implementation would result in additional power consumption for collecting and processing the additional error samples. Collecting only 2-bits of the error samples provides an improved power consumption solution to provide a system with well-adapted DFE coefficients.

Figure 8:
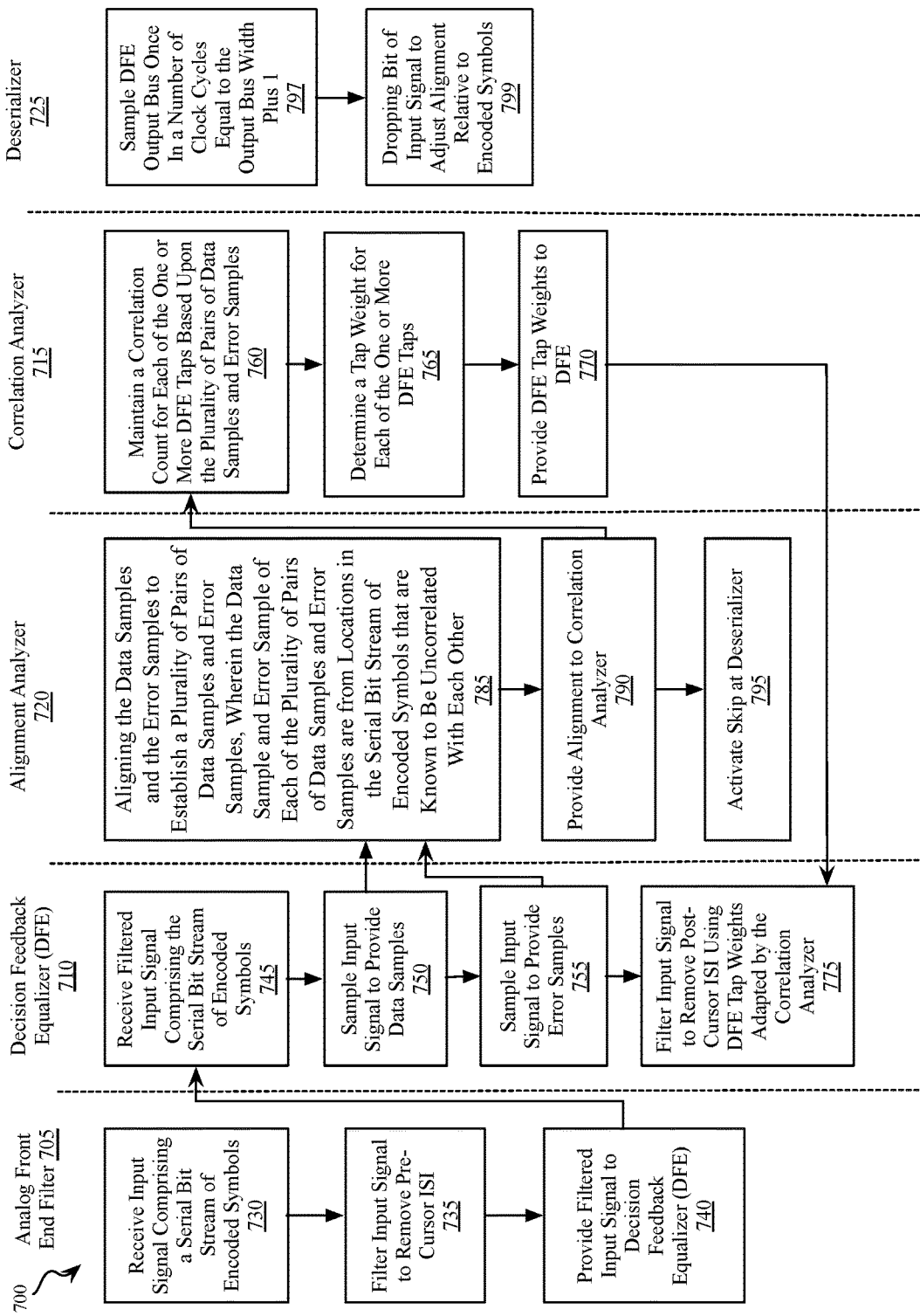
FIG. 8 is a swim diagram illustrating a method for adapting DFE tap weight that addresses 8b/10b internal bit correlation, in accordance with an embodiment of the present invention.

FIG. 8 is a swim-diagram of an exemplary process 700 for adapting tap weights of a decision feedback equalizer (DFE), in accordance with an embodiment of the present invention. For example, the process 700 can be implemented in a SerDes receiver during the adaption process of the DFE taps while running 8b/10b data, wherein the process 700 removes the impact of the 8b/10b internal correlation on the adaptation process. FIG. 8 illustrates lanes for steps that can be performed by an analog front-end filter 705, a decision feedback equalizer (DFE) 710, a correlation analyzer 715, an alignment analyzer 720 and a deserializer 725 of a SerDes receiver.

To perform DFE tap adaptation, the analog front-end filter 705 first receives an input signal comprising a serial bit stream of encoded symbols 730. In one embodiment, the plurality of encoded symbols are 8b/10b encoded symbols. The analog front-end filter 705 filters the input signal to remove pre-cursor ISI 735 and then provides the filtered input signal to the decision feedback equalizer 710 (740.) The analog front-end filter 705 may employ various known filtering techniques to filter the input signal, such as a Continuous Time Linear Equalizer (CTLE) equalization or Feed-Forward Equalization (FFE).

The DFE 710 receives the filtered input signal comprising the serial bit stream of encoded symbols 745. The DFE 710 then filters the input signal to remove post-cursor ISI using DFE tap weights adapted by the correlation analyzer 715 (775).

In order to provide the adapted tap weights for the DFE 710, a data sampler of the DFE 710 samples the input signal to provide data samples 750 and an error sampler of the DFE 710 samples the input signal to provide error samples 755. The alignment analyzer 720 then aligns the data samples and the error samples to establish a plurality of pairs of data samples and error samples, wherein the data sample and error sample of each of the plurality of pairs of data samples and error samples are from locations in the serial bit stream of encoded symbols that are known to be uncorrelated with each other 785. As previously described either comma character alignment or di-bit correlation alignment may be used to determine the alignment of the data samples and error samples taken from the input signal. The Alignment analyzer 720 then provides the alignment to the correlation analyzer 715 (790) and may activate a skip function at the deserializer 725 (795) to establish the proper alignment of the PMA output.

The correlation analyzer 715 maintains a correlation count for each of one or more DFE taps 760 based upon the plurality of pairs of data samples and error samples. The correlation analyzer 715 then determines a tap weight for each of the DFE taps based upon the correlation counts 765 and provides the DFE tap weights to the DFE 710 (770), thereby adapting the DFE taps of the DFE 710.

To adjust the input signal to the required alignment, a skip is activated for the deserializer 725 (795). The deserializer 725 samples the output bus of the DFE 710 once in a number of clock cycles equal to the output bus width plus 1 797, thereby dropping a bit of the input signal to adjust the alignment relative to the encoded symbols of the input signal 799 based upon the alignment determined by the alignment analyzer 720.

As such, as illustrated in the swim-diagram of FIG. 8 the decision feedback equalizer (DFE) 710 tap weights are adapted for running 8b/10b data, wherein the process 700 removes the impact that the 8b/10b internal bit correlation has on the adaptation process of the DFE 710 tap weights. The alignment analyzer 720, in combination with the deserializer 725, establish the required alignment of the input signal that allows the DFE 710 to collect data samples from one 8b/10b symbol and to collect error samples from a different 8b/10b symbol, thereby removing the impact of the 8b/10b internal bit correlation on the DFE tap adaptation process.

Figure 9:
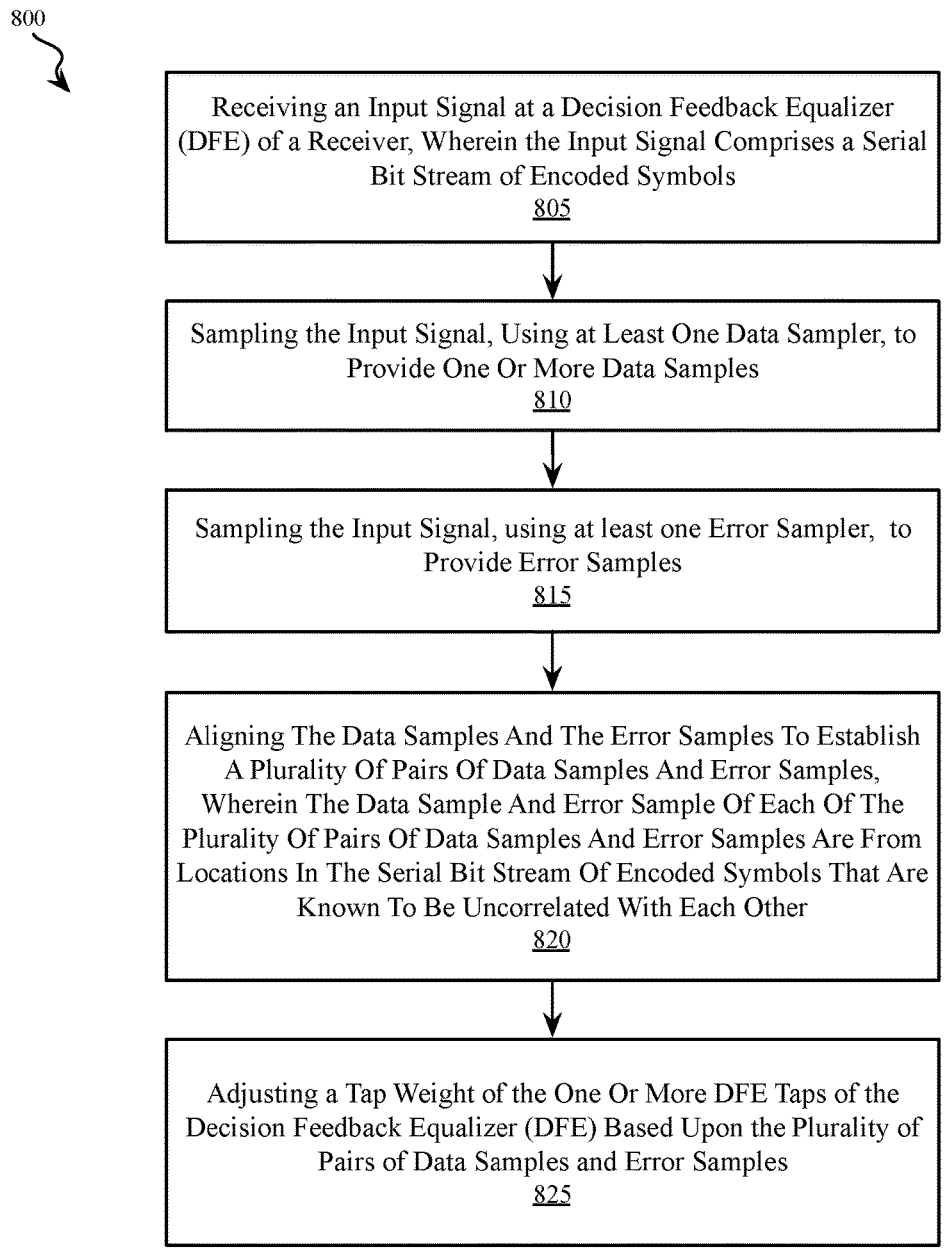
FIG. 9 is a flow diagram illustrating a method for adapting DFE tap weight that addresses 8b/10b internal bit correlation, in accordance with an embodiment of the present invention.

FIG. 9 is a flow diagram of a method 800 for decision feedback equalizer (DFE) tap adaptation, in accordance with an embodiment of the present invention. At operation 805, the method includes receiving an input signal at a decision feedback equalizer (DFE) of a receiver, wherein the input signal comprises a serial bit stream of encoded symbols. With reference to FIG. 4, in the present invention, the decision feedback equalizer (DFE) 320 is configured for receiving the input signal 310. In one embodiment, the input signal 310 may be filtered by an analog front-end filter 315 prior to being received at the DFE 320.

At operation 810, the method 800 continues by sampling the input signal, using at least one data sampler, to provide data samples and at operation 815 by sampling the input signal, using at least one error sampler, to provide error samples. With reference to FIG. 4, in the present invention, the data sampler 360 of the correlation analyzer 335 is configured for sampling the input signal to provide data samples. Additionally, the error sampler 365 is configured for sampling the input signal to provide error samples.

At step 820, the method 800 continues by aligning the data samples and the error samples to establish a plurality of pairs of data samples and error samples, wherein the data sample and error sample of each of the plurality of pairs of data samples and error samples are from locations in the serial bit stream of encoded symbols that are known to be uncorrelated with each other. With reference to FIG. 4, in the present invention, the alignment analyzer 325 configured for aligning the data samples and the error samples to establish a plurality of pairs of data samples and error samples, wherein the data sample and error sample of each of the plurality of pairs of data samples and error samples are from locations in the serial bit stream of encoded symbols that are known to be uncorrelated with each other.

At step 825, the method 800 concludes by adjusting a tap weight of the one or more DFE taps of the DFE based upon the plurality of pairs of data samples and error samples. With reference to FIG. 4, in the present invention, the correlation analyzer 335 adjusts the tap weight of one or more of the DFE taps to complete the adaptation of the DFE tap weights. In a specific embodiment, adjusting a tap weight of one or more DFE taps based upon the plurality of pairs of data samples and error samples, further comprises maintaining a correlation count for each of the one or more DFE taps.

As such, the present invention provides an improved system and method for DFE tap adaptation that addresses the undesirable correlation between the internal bits of an 8b/10b encoded symbol.

In one embodiment, portions of the SerDes receiver may be implemented in an integrated circuit as a single semiconductor die. Alternatively, the integrated circuit may include multiple semiconductor die that are electrically coupled together such as, for example, a multi-chip module that is packaged in a single integrated circuit package.

In various embodiments, portions of the system of the present invention may be implemented in a Field Programmable Gate Array (FPGA) or Application Specific Integrated Circuit (ASIC). As would be appreciated by one skilled in the art, various functions of circuit elements may also be implemented as processing steps in a software program. Such software may be employed in, for example, a digital signal processor, a network processor, a microcontroller or general-purpose computer.

Unless specifically stated otherwise as apparent from the discussion, it is appreciated that throughout the description, discussions utilizing terms such as "receiving", "determining", "generating", "limiting", "sending", "counting", "classifying", or the like, can refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

The present invention may be embodied on various computing platforms that perform actions responsive to software-based instructions. The following provides an antecedent basis for the information technology that may be utilized to enable the invention.

The method of the present invention may be stored on a computer readable medium which may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any non-transitory, tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. However, as indicated above, due to circuit statutory subject matter restrictions, claims to this invention as a software product are those embodied in a non-transitory software medium such as a computer hard drive, flash-RAM, optical disk or the like.

Program code embodied on a computer readable medium may be transmitted using any appropriate medium, including but not limited to wireless, wire-line, optical fiber cable, radio frequency, etc., or any suitable combination of the foregoing. Computer program code for carrying out operations for aspects of the present invention may be written in any combination of one or more programming languages, including an object-oriented programming language such as Java, C#, C++, Visual Basic or the like and conventional procedural programming languages, such as the "C" programming language or similar programming languages.

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Further, for purposes of discussing and understanding the embodiments of the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

What I claim is:

1. A method for decision feedback equalizer (DFE) tap adaptation, the method comprising:
    receiving an input signal at a DFE of a receiver, wherein the input signal comprises a serial bit stream of encoded symbols;
    sampling the input signal, using at least one data sampler, to provide data samples;
    sampling the input, using at least one error samplers, to provide error samples;
    aligning the data samples and the error samples to establish a plurality of pairs of data samples and error samples, wherein the data sample and error sample of each of the plurality of pairs of data samples and error samples are from locations in the serial bit stream of encoded symbols that are known to be uncorrelated with each other; and
    adjusting a tap weight of one or more DFE taps based upon the plurality of pairs of data samples and error samples.

2. The method of claim 1, wherein aligning the data samples and the error samples to establish a plurality of pairs of data samples and error samples, further comprises:
    aligning the data samples and the error samples using one or more symbol boundaries to establish the plurality of pairs of data samples and error samples.

3. The method of claim 1, wherein aligning the data samples and the error samples to establish a plurality of pairs of data samples and error samples, further comprises:
    identifying di-bit correlation properties of a plurality of bits of the serial bit stream of encoded symbols; and
    aligning the data samples and the error samples based upon the di-bit correlation properties to establish the plurality of pairs of data samples and error samples.

4. The method of claim 1, wherein adjusting a tap weight of one or more DFE taps based upon the plurality of pairs of data samples and error samples, further comprises maintaining a correlation count for each of the one or more DFE taps.

5. The method of claim 4, wherein adjusting a tap weight of one or more DFE taps based upon the plurality of pairs of data samples and error samples, further comprises:
    increasing the tap weight of the one or more DFE taps if the correlation count indicates that the data samples and the error samples are correlated; and
    decreasing the tap weight of the one or more DFE taps if the correlation count indicates that the data samples and the error samples are anti-correlated.

6. The method of claim 1, wherein aligning the data samples and the error samples to establish a plurality of pairs of data samples and errors samples further comprises:
    aligning the data sample and the error sample of each of the plurality of pairs of data samples and error samples to be from different encoded symbols of the serial bit stream of encoded symbols.

7. The method of claim 1, wherein the encoded symbols are 8b/10b encoded symbols, and wherein aligning the data samples and the error samples to establish a plurality of pairs of data samples and errors samples further comprises aligning the data sample and the error sample of each of the plurality of pairs of data samples and error samples in different 8b/10b encoded symbols of the serial bit stream of encoded symbols.

8. The method of claim 1, wherein the encoded symbols are 8b/10b encoded symbols comprising a 5b/6b (5-bit word to 6-bit symbol) portion and a 3b/4b (3-bit word to 4-bit symbol) portion, and wherein aligning the data samples and the error samples to establish a plurality of pairs of data samples and errors samples further comprises aligning the data sample of a pair of data samples and error samples in the 5b/6b portion of an 8b/10b encoded symbol of the serial bit stream of encoded symbols and aligning the error sample of the pair of data samples and error samples in the 3b/4b portion of the 8b/10b encoded symbol of the serial bit stream of encoded symbols.

9. The method of claim 1, wherein the receiver is a Serializer/Deserializer (SerDes) receiver.

10. A system comprising:
    a decision feedback equalizer (DFE) comprising one or more taps, the DFE configured to receive an input signal comprising a serial bit stream of encoded symbols, the DFE including at least one data sampler for sampling the input signal to provide data samples and at least one error sampler for sampling the input signal to provide error samples;
    an alignment analyzer configured to align the data samples and the error samples and configured to establish a plurality of pairs of data samples and error samples, wherein the data sample and error sample of each of the plurality of pairs of data samples and error samples are from locations in the serial bit stream of encoded symbols that are known to be uncorrelated with each other; and
    a correlation analyzer configured to adjust a tap weight of the one or more DFE taps based upon the plurality of pairs of data samples and error samples.

11. The system of claim 10, wherein the alignment analyzer is further configured to:
    align the data samples and the error sample using one or more symbol boundaries to establish the plurality of pairs of data samples and error samples.

12. The system of claim 10, wherein the alignment analyzer is further configured to:
    identify di-bit correlation properties of a plurality of bits of the serial bit stream of encoded symbols; and
    align the data samples and the error samples based upon the di-bit correlation properties to establish the plurality of pairs of data samples and error samples.

13. The system of claim 10, wherein the correlation analyzer comprises at least one correlation counter, the at least one correlation counter configured to maintain a correlation count for each of the one or more taps of the DFE, and wherein the tap weight of the one or more DFE taps is increased if the correlation count indicates that the data samples and the error samples are correlated and the tap weight of the one or more DFE taps is decreased if the correlation count indicates that the data samples and the error samples are anti-correlated.

14. The system of claim 10, wherein the alignment analyzer is further configured to identify di-bit correlation properties of a plurality of bits of the serial bit stream of encoded symbols of the input signal and to align the data samples and error samples based upon the di-bit correlation properties to establish the plurality of pairs of data samples and error samples.

15. The system of claim 10, wherein the alignment analyzer is further configured to align the data samples and error samples with a symbol boundary of the encoded symbols to establish the plurality of pairs of data samples and error samples.

16. The system of claim 10, wherein the alignment analyzer is further configured to select the data sample and error sample of each of the plurality of pairs of data samples and error samples to be from different symbols of the serial bit stream of encoded symbols.

17. The system of claim 10, wherein the encoded symbols are 8b/10b encoded symbols comprising a 5b/6b (5-bit word to 6-bit symbol) portion and a 3b/4b (3-bit word to 4-bit symbol) portion, the alignment analyzer is further configured to align the data samples and error samples with a 6-bit/4-bit symbol boundary to establish the plurality of pairs of data samples and error samples.

18. A system comprising:
   a decision feedback equalizer (DFE) comprising one or more taps, the DFE configured to receive an input signal comprising a serial bit stream of 8b/10b encoded symbols,
   the DFE including at least one data sampler configured to sample the input signal to provide data samples and at least one error sampler configured to sample the input signal to provide error samples;
   an alignment analyzer configured to align the data samples and the error samples to establish a plurality of pairs of data samples and error samples, wherein the data sample and error sample of each of the plurality of pairs of data samples and error samples are from locations in the serial bit stream of encoded symbols that are known to be uncorrelated with each other;
   a correlation analyzer configured to adjust a tap weight of the one or more DFE taps based upon the plurality of pairs of data samples and error samples; and
   a deserializer coupled to the alignment analyzer and to the correlation analyzer, the deserializer configured to drop one or more bits of the input signal to align the data samples and the error samples to establish the plurality of pairs of data samples and error samples.

19. The system of claim 18, wherein the encoded symbols are 8b/10b encoded symbols comprising a 5b/6b (5-bit word to 6-bit symbol) portion and a 3b/4b (3-bit word to 4-bit symbol) portion, and wherein the alignment analyzer includes a circuit configured to align the data samples and error samples with a 6-bit/4-bit symbol boundary to establish the plurality of pairs of data samples and error samples.

* * * * *